(12) United States Patent
Siebert et al.

(10) Patent No.: US 11,040,564 B2
(45) Date of Patent: Jun. 22, 2021

(54) METHOD FOR FORMING AND DETECTING SECURITY ELEMENTS ON THE SURFACE OF A COMPONENT OR IN A COMPONENT, AND SYSTEM FOR DETECTING SAID SECURITY ELEMENT

(71) Applicants: FRAUNHOFER-GESELLSCHAFT ZUR FOERDERUNG DER ANGEWANDTEN FORSCHUNG E.V., Munich (DE); TECHNISCHE UNIVERSITAET DRESDEN, Dresden (DE)

(72) Inventors: Rene Siebert, Dresden (DE); Robert Baumann, Dresden (DE)

(73) Assignees: FRAUNHOFER-GESELLSCHAFT ZUR FOERDERUNG DER ANGEWANDTEN FORSCHUNG E.V., Munich (DE); TECHNISCHE UNIVERSITAET DRESDEN, Dresden (DE)

( * ) Notice: Subject to any disclaimer, the term of this patent is extended or adjusted under 35 U.S.C. 154(b) by 0 days.

(21) Appl. No.: 16/099,105

(22) PCT Filed: Apr. 26, 2017

(86) PCT No.: PCT/EP2017/059926
§ 371 (c)(1),
(2) Date: Nov. 5, 2018

(87) PCT Pub. No.: WO2017/191008
PCT Pub. Date: Nov. 9, 2017

(65) Prior Publication Data
US 2019/0202228 A1 Jul. 4, 2019

(30) Foreign Application Priority Data
May 4, 2016 (DE) ..................... 10 2016 207 756.2

(51) Int. Cl.
*G06K 19/12* (2006.01)
*B42D 25/435* (2014.01)
(Continued)

(52) U.S. Cl.
CPC ......... *B42D 25/435* (2014.10); *B42D 25/369* (2014.10); *B42D 25/41* (2014.10);
(Continued)

(58) Field of Classification Search
CPC .... B42D 25/435; B42D 25/369; B42D 25/41; G06K 7/088; G06K 19/12; G06K 2009/0059
(Continued)

(56) References Cited

U.S. PATENT DOCUMENTS 5,346,738 A * 9/1994 Samonides ............. B44C 1/227
428/195.1
5,545,885 A * 8/1996 Jagielinski ............. G06K 7/084
235/449
(Continued)

FOREIGN PATENT DOCUMENTS

DE 10056807 5/2002
DE 19909723 4/2004
(Continued)

OTHER PUBLICATIONS

Falk et al. Optical Detection of Magnetic Stray Fields. Optios Communications, vol. 24, No. 1, Jan. 1, 1978, pp. 129-132.

*Primary Examiner* — Paultep Savusdiphol
(74) *Attorney, Agent, or Firm* — Jacobson Holman PLLC

(57) ABSTRACT

The invention relates to a method for forming and detecting security elements on the surface of a component and/or in a component, in which at least one layer or at least one region that is preferably formed of a magnetic material or of a (Continued)

Figure 1:
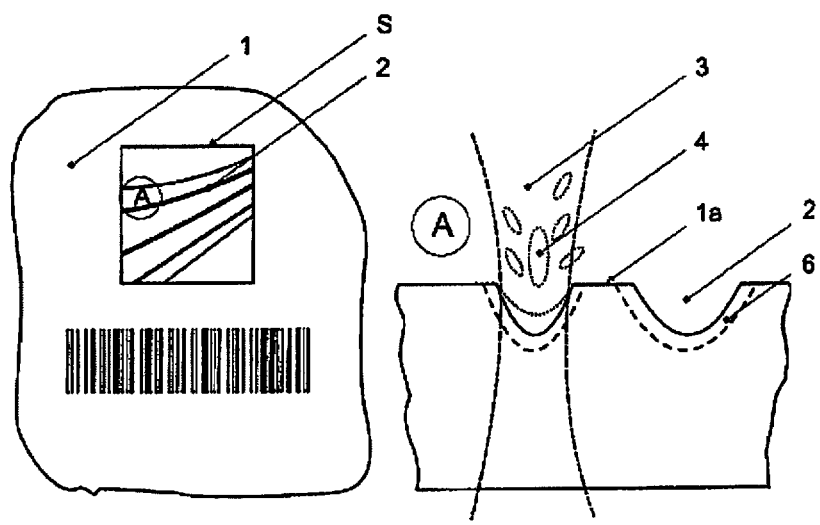

material different from the component material is formed on the surface of the component and/or in the component that is formed of a magnetic or of a nonmagnetic material in a locally and geometrically defined manner. At least one ablated track, at least one heat-affected region and/or at least one remelted treatment track are/is formed by a locally and geometrically defined ablation of material or input of energy on/at the surface of a component along a predefined contour corresponding to the respective security feature. In the manufacture of the component, a magnetic material different from the material of the component is introduced into the component at at least one predefined position in a locally and geometrically defined manner by way of a generative production process. To detect the security element, a magnetization unit is used to generate at least one magnetic field penetrating into the component or a magnetic flux is produced inside the magnetization unit that penetrates into the component. To check a security element formed in this way, a detection unit is used to detect the magnetic stray fields occurring on the security element as a result of the at least one magnetic field, and the measurement signals captured by the detection unit are transferred to an evaluation unit having an image-processing or pattern-recognition system. Using the evaluation unit having an image-processing or pattern-recognition system, it is checked, by way of the detected magnetic stray fields, whether or not the detected security element corresponds to a specification.

10 Claims, 5 Drawing Sheets

(51) Int. Cl.
*G07D 7/04* (2016.01)
*B42D 25/41* (2014.01)
*B42D 25/369* (2014.01)
*G01R 33/032* (2006.01)
*G06K 7/08* (2006.01)
*G01R 33/00* (2006.01)
*G07D 7/00* (2016.01)
*G06K 9/00* (2006.01)

(52) U.S. Cl.
CPC .......... *G01R 33/00* (2013.01); *G01R 33/032* (2013.01); *G06K 7/082* (2013.01); *G07D 7/003* (2017.05); *G07D 7/04* (2013.01); *G06K 7/08* (2013.01); *G06K 7/088* (2013.01); *G06K 19/12* (2013.01); *G06K 2009/0059* (2013.01)

(58) Field of Classification Search
USPC .................................. 235/487, 493, 449, 450
See application file for complete search history.

(56) References Cited

U.S. PATENT DOCUMENTS

| | | | |
|---|---|---|---|
| 6,318,758 B1* | 11/2001 | Stenzel | B42D 25/355 |
| | | | 283/72 |
| 2013/0029112 A1* | 1/2013 | Bargir | B41F 11/02 |
| | | | 428/195.1 |
| 2015/0102108 A1* | 4/2015 | Ehresmann | H01F 10/3218 |
| | | | 235/449 |
| 2015/0231912 A1* | 8/2015 | Yoon | B42D 25/30 |
| | | | 283/85 |
| 2016/0042265 A1* | 2/2016 | Rahm | G07D 7/04 |
| | | | 235/449 |

FOREIGN PATENT DOCUMENTS

| | | |
|---|---|---|
| DE | 10248142 | 7/2004 |
| DE | 102009043597 | 4/2011 |
| DE | 102011007293 | 5/2012 |
| EP | 1500521 | 1/2005 |
| WO | 2012/049538 | 4/2012 |

\* cited by examiner

METHOD FOR FORMING AND DETECTING SECURITY ELEMENTS ON THE SURFACE OF A COMPONENT OR IN A COMPONENT, AND SYSTEM FOR DETECTING SAID SECURITY ELEMENT

The invention relates to a method for forming and detecting security elements on the surface of a component or in a component, and a system for detecting the security element.

Security features on or in products that attest to authenticity are used to protect against counterfeiting and against unauthorized replication of the products of a manufacturer. Such security features may also be used to track products in production or to document the life cycle of the component, in particular in the case of security-relevant replacement parts.

To achieve this, structures or security elements may be produced on the surface of a component or introduced inside a component. To track components, it is possible for example to apply simple structures in the form of a bar code or the like.

DE 199 09 723 C5 describes a security adhesive film that contains a diffusible identification medium. It is bonded to an object to be secured and leaves a logo when it is subsequently removed. The form of the logo is produced for example by way of a laser that locally perforates or removes the barrier layer between the film and the component. The logo on the component is able to be removed by subsequent work. In the case of product imitation or of product replication, this logo is likewise able to be copied, as it is able to be recognized by the naked eye and discloses the location of the security feature. In addition, these security adhesive films have weaknesses with regard to their ability to be read by a machine.

U.S. Pat. No. 5,346,738 B describes a security label that contains an acid in microencapsulated form as identification medium. During the process of sticking this sticker on a component, pressure is exerted, as a result of which the encapsulation breaks and the identification medium is released. Said medium diffuses to the substrate surface and triggers an etching reaction. The disadvantage is that the marking process is a central part of the manufacturing process and therefore has to be performed by a label manufacturer. This impacts the customization options for the product manufacturer, and the etched security feature is also optically recognizable.

EP 1 500 521 A2 describes security elements having machine-readable features and color effects in order to improve security against counterfeiting and replication. The security feature is machine-readable and preferably magnetically encoded. This magnetic feature is produced for example by printing a varnish layer containing magnetic particles on a film and printing over this with additional white, colored or luminescent varnishes. This does provide security elements that contain machine-readable features and are not able to be recognized by the naked eye, but a film is always required in order to do this. These films are generally used on documents of value, on data carriers, on banknotes or special seals and permits. These films are therefore not manufactured by said manufacturer of the products, as a result of which said manufacturer is deprived of the option of producing his own structures and depictions. Since these films are manufactured in large numbers, it is also not possible to create product-specific identification for the purpose of product tracking, since this would have had to have been integrated into the manufacturer's production process.

DE 10 2011 007 293 A1 discloses a radiofrequency identification (RFID) system in which a transponder is integrated into a product and is not subsequently able to be removed. The security features are able to be read from a close distance, as a result of which the location of the security features is disclosed. Copying of such systems is thereby facilitated.

The disadvantage of the known methods and security elements is that their position on the component is able to be recognized and the security elements are able to be replicated as they are able to be perceived with the naked eye. When using films or security elements that are introduced into the component or applied to the component, considerable additional outlay is created with regard to the manufacture of the products, and the manufacturer does not have the option of customizing product-specific security elements.

The object of the invention is therefore to propose options for forming and detecting security elements in or on components that make replication more difficult and that are able to be manufactured in a cost-effective manner.

According to the invention, this object is achieved by a method for forming and detecting security elements on the surface ($1a$) of a component ($1$) and/or in a component ($1$), in which at least one layer or at least one region that is preferably formed of a magnetic material or of a material different from the component material is formed on the surface (la) of the component ($1$) and/or in the component ($1$) that is formed of a magnetic or of a non-magnetic material in a locally and geometrically defined manner, wherein at least one ablated track ($2$), at least one heat-affected region ($6$) and/or at least one remelted treatment track ($9$) are/is formed by a locally and geometrically defined ablation of material or input of energy on/at the surface ($1a$) of a component ($1$) along a predefined contour corresponding to the respective security feature (S) or in the manufacture of the component ($1$), a magnetic material ($16$) different from the material of the component ($1$) is introduced into the component ($1$) at least one predefined position in a locally and geometrically defined manner by way of a generative production process and to detect the security element (S), a magnetization unit is used to generate at least one magnetic field penetrating into the component ($1$) or a magnetic flux is produced inside the magnetization unit that penetrates into the component ($1$) and to check a security element (S) formed in this way, a detection unit ($10$) is used to detect the magnetic stray fields occurring on the security element (S) as a result of the at least one magnetic field, and the measurement signals captured by the detection unit are transferred to an evaluation unit having an image-processing or pattern-recognition system, and using the evaluation unit having an image-processing or pattern-recognition system, it is checked, by way of the detected magnetic stray fields, whether or not the detected security element (S) corresponds to a specification. A system invention for use in the method according the invention consists of a magnetization unit by way of which, at least in that region of the component ($1$) in which a security feature (S) has been formed, magnetization of a magnetic material present there can achieved, and a detection unit ($10$) for detecting magnetic stray fields generated in the component ($1$), and an evaluation unit having an image-processing or pattern-recognition system for evaluating or recognizing the detected magnetic stray fields and for checking whether or not the captured measurement signals correspond to a specification for a security feature (S). Advantageous refinements and developments of the invention may be produced by way of features mentioned below.

In a method according to the invention for forming and detecting security elements on the surface of a component or inside a component, a component is formed from a magnetic material, in particular a ferromagnetic or ferrimagnetic material. In one alternative, the component is formed from a non-magnetic material, in particular a non-ferromagnetic material, and a layer or a region made of a magnetic material or of a material different from the component material is formed on the surface of the component or inside the component.

A security element is formed on or at the surface of the component or inside the component in a locally and geometrically defined manner.

In one alternative according to the invention, at least one ablated track, at least one heat-affected region and/or at least one remelted treatment track are/is formed by a local and geometrically defined ablation of material or input of energy on/at the surface of a component along a predefined contour corresponding to the respective security feature.

In another alternative according to the invention, in the manufacture of the component, a magnetic material different from the material of the component is introduced into the component at at least one predefined position in a locally and geometrically defined manner by way of a generative production process.

To detect the security element, a magnetization unit is used to generate at least one magnetic field penetrating into the component and/or a magnetic flux is produced in the magnetization unit that penetrates into the component. To check a security element formed in this way, a detection unit is used to detect the magnetic stray fields occurring on the security element as a result of the at least one magnetic field, and the measurement signals captured by the detection unit are transferred to an evaluation unit having an image-processing or pattern-recognition system.

Using the evaluation unit having an image-processing or pattern-recognition system, it is checked, by way of the detected magnetic stray fields, whether or not the detected security element corresponds to a specification.

The ablation of material and/or an input of energy may in this case be achieved by way of an energy beam, preferably by way of a laser beam, electron beam or ion beam.

The at least one ablated track may advantageously should be at least partially filled with a material different from the component material, preferably a nonmagnetic material. To this end, it is possible to use a pulverulent or viscous material that is preferably at least partially sintered or melted together as a result of a heat treatment. The heat treatment may be performed in a furnace or with an energy beam, preferably with the energy beam used beforehand.

A paste containing for example particles of metal, oxide, carbide, nitride and/or a polymer may also be introduced into the ablated track.

A system by way of which the method according to the invention is able to be performed has a magnetization unit by way of which, at least in that region of the component in which a security feature has been formed, magnetization of a magnetic material present there is able to be achieved, a detection unit for detecting magnetic stray fields generated in the component, and an evaluation unit having an image-processing or pattern-recognition system for evaluating or recognizing the detected magnetic stray fields and for checking whether or not the captured measurement signals correspond to a specification for a security feature.

The focal spot of a laser beam may be moved over the component at a feed rate in the range of 0.1 m/s to 22 m/min to form a security element. The selected laser power may preferably lie in the range of 50 W to 5000 W. The diameter of the focal spot in the focal plane should lie in the range from 10 µm to 1000 µm. A suitable wavelength of a solid-state laser that is used may in this case be 0.34 µm to 10.6 µm.

Through the selection of the parameters of the energy beam, such as its geometric cross-sectional shape, the diameter of its focal point, its power, the feed rate at which the focal spot is moved over the surface of the component, and/or the number of transitions over a region to be ablated, it is possible to influence the geometry of the ablation and thus of the security feature to be formed. In this case, it is possible to form a heat-affected region in the region around the actual ablated track, in which region the micromagnetic structure of the material changes. Targeted influencing of this region may thus be used to form elements of a security element.

In a second variant, a component is manufactured by way of a generative production process. During the method, a further material is introduced into the component and/or recesses are formed in the component in a locally and geometrically defined manner.

A further material introduced into the component should be formed from a nonmagnetic material or from a magnetic material different from the material of the component. A magnetic material may for example be an iron alloy containing at least one of the following chemical elements besides iron: cobalt, nickel, chromium and manganese, silicon and aluminum.

The further material may be introduced into the component in the form of powder having a particle diameter of at most 100 µm, preferably at most 20 µm. The further material may be heated to above its melting point, and the particles may melt together. A pulverulent material may also be coated with a top layer when it has been introduced into an ablated track.

In this case, machine-readable one-dimensional, two-dimensional or quasi-three-dimensional information, such as for example bar codes or matrix codes, may be formed on the security element.

To detect the security element, a magnetization unit generates magnetic fields penetrating into the component. The stray fields forming in this case are captured by a detection unit and transferred to an evaluation unit having an image-processing or pattern-recognition system.

The evaluation unit having an image-processing or pattern-recognition system determines the security element from the detected magnetic stray fields. A graphic depiction of the detected security element or a statement as to whether this security element corresponds to a specification may be transferred to a display apparatus that is connected to the evaluation unit.

A security element formed in the method according to the invention may be formed as part of a product logo and/or company logo that is visible to the eye. As an alternative or at the same time, it should not be visible to the eye and/or not able to be felt haptically without additional auxiliary means. It is not able to be recognized without an appropriate detection system. The position of the feature on the component and also the security element as such therefore remains hidden per se, and is thus not readily able to be replicated.

To hide the position of a security element according to the invention on the surface of a component, a top layer, in particular in the form of a varnish or in the form of an insulation layer, may additionally be applied to the component surface and therefore also to the security element. This should not influence the magnetization, which changes when the security feature is formed, in the region of the security feature, and should preferably be optically non-transparent (opaque).

A top layer should be used if for example material has been ablated in a locally and geometrically defined manner using an energy beam, in which at least one depression has been formed in the surface of a component, and the at least one depression is filled at least partially with a magnetic material, in the case of a non-magnetic component material, or a different magnetic material in the case of a magnetic component material.

A system for use in the method according to the invention is formed of a magnetization unit, of a detection unit, of an evaluation unit having an image-processing or pattern-recognition system, and possibly of a display apparatus connected to the evaluation unit.

The magnetization unit is used to introduce magnetic fields into the component, such that magnetic stray fields form on and around the security element. This may be achieved by the induction of a magnetic flux into the component or by way of static magnetic fields.

The detection unit detects the magnetic stray fields forming in the component and transfers these to the evaluation unit. The detection unit may in this case contain a magneto-optical sensor that is used together with an additional magnetic layer having high anisotropy, as described for example in DE 40 21 359 A1 in the form of a Kerr microscope, or at least one inductive or capacitive sensor detecting in a spatially resolved manner.

A resolution in the range of 5 µm to 100 µm, preferably in the range of 5 µm to 25 µm, is able to be achieved by way of the detection unit.

The evaluation unit having an image-processing or pattern-recognition system evaluates the generated magnetic stray fields and calculates therefrom a graphic depiction of the security element formed in the component or on the surface thereof or a statement as to whether or not a detected security element corresponds to a specification.

The calculated graphic depiction of the security element or the statement with regard to the correspondence with a specification may be transferred to the display apparatus.

The detection unit may be formed such that it examines the security element to be tested in partial regions. In this way, it is possible to stop the examination if the evaluation unit has already recognized a deviation from a specified security element in the first partial regions.

By way of the method according to the invention, it is possible to form and detect hidden company-specific and product-specific security features in order to protect against product piracy in the form of an authenticity certificate, or in order to document and control production processes. In this case, detection is possible only with knowledge of the position of the security element in the component or on the surface thereof. The copying or replication of the security element is thereby made more difficult.

Figure 2:
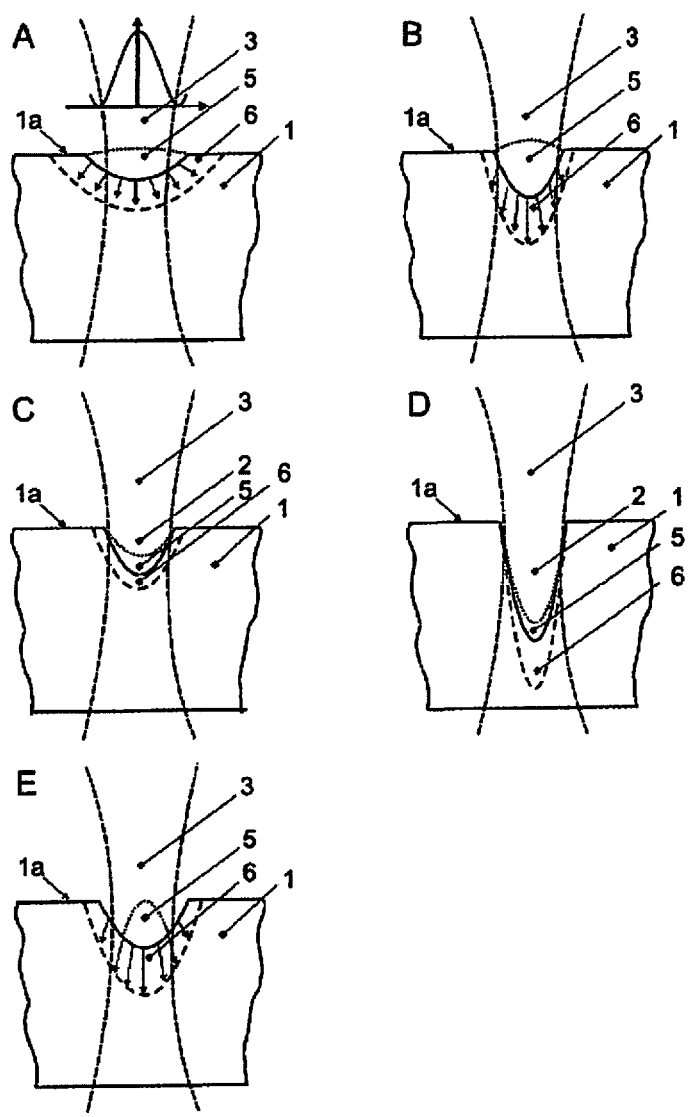
Figure 3:
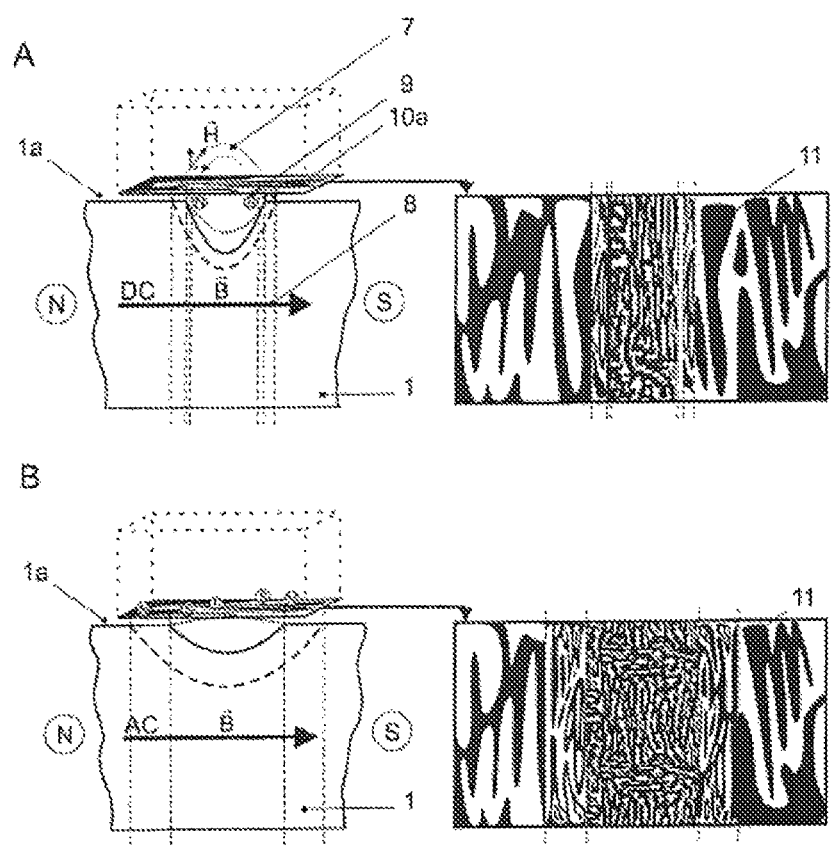
Figure 4:
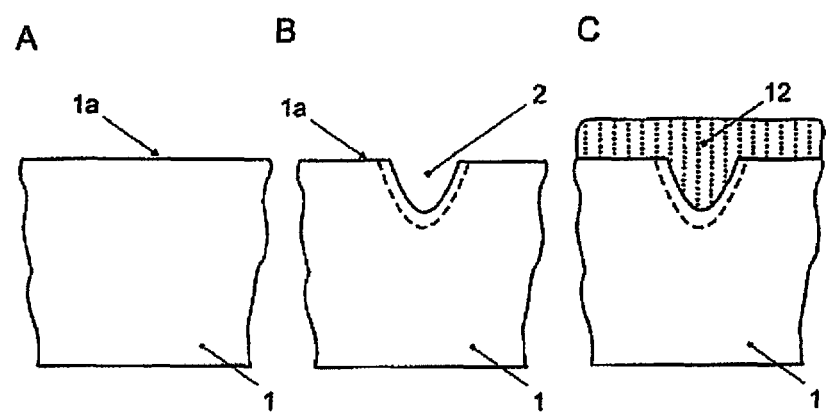
Figure 5:
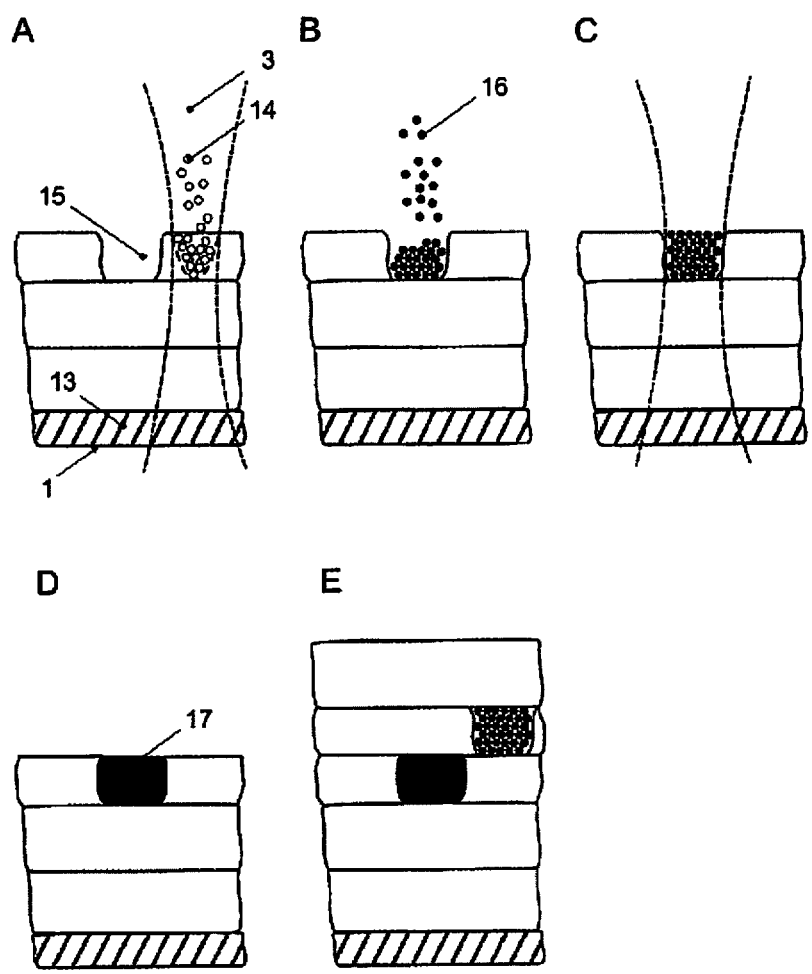

The invention is intended to be explained in further detail below with reference to examples. In the figures:

FIG. 1 shows a depiction in principle of the refinement of an exemplary security element, FIG. 2 shows possible refinement variants of the method for producing a security element according to the invention, FIG. 3 shows an example of the detection of security features, FIG. 4 shows a depiction in principle of the application of an exemplary security element and of a top layer, and FIG. 5 shows a depiction in principle of the formation of an exemplary security element during a generative production process.

FIG. 1 is a depiction in principle of the refinement of an exemplary security element S on a surface 1a of a component 1. The component is formed from an unalloyed structural steel for parts in general mechanical and vehicle construction C40E (material number 1. 1186). After three irradiation procedures using a laser beam 3 having a focal spot feed rate of 1 m/s, a power of 100 W and a focal diameter of 29 µm, a geometrically and locally defined ablation of material 4 in the form of a logo was achieved in the component 1. The focal spot was thus moved along the contour of the security feature S three times.

The cross section of the region referenced A is shown in the right-hand part of FIG. 1. An ablated track 2 is formed by the ablation of material, the geometric formation of which track is influenced by the parameters of the laser beam 3. In the region around the ablated track 2, a heat-affected region 6, in which the micromagnetic structure of the material changes, is generated by the heat treatment by way of the laser beam. This region is likewise part of the security element 5, as is the ablated track 2. The ablated track 2 had a depth of 25 µm and a width of 50 µm. The heat-affected region 6 had a width of 50 µm next to the ablated track 2.

FIG. 2 depicts principle refinement variants of the method for manufacturing a security element S according to the invention on the surface 1a of a component 1.

In refinement variant A, a treatment track 5 was melted in a locally and geometrically defined manner on the surface 1a of the component 1 by way of a laser beam 3, which treatment track subsequently resolidified, i.e. was remelted. A heat-affected region 6 formed in the region of the treatment track 5. As a result of the heat treatment, the micromagnetic structure of the component material was changed both in the treatment track 5 and in the heat-affected region 6. This change is able to be recognized in the detection of the security element S and in the evaluation of the magnetic stray fields forming in the component 1, and viewed on a display apparatus.

In refinement variant B, the form and depth of the treatment track 5 and of the heat-affected region 6 was varied in comparison to refinement variant A by varying the parameters of the laser beam 3. In this case, in comparison with refinement variant A, the size of the area of the focal spot was not changed, the number of irradiation procedures was reduced, the power used was increased and/or the feed rate of the focal spot of the energy beam was increased. The formation of the security element S is able to be influenced in a targeted manner by way of such variations.

In refinement variant C, a combination of an ablated track 2 and a melted and resolidified treatment track 5 on the surface 1a of a component 1 is depicted. In this case too, a heat-affected region 6 formed as part of the security element S. This is able to be achieved by increasing the number of irradiation procedures without the area of the focal spot being changed, by reducing the power used and/or increasing the feed rate of the focal spot movement in comparison with the formation in refinement variant A.

Refinement variant D shows how, by changing the process parameters of the laser beam 3, the geometry of the ablated track 2, of the treatment track 5 and of the heat-affected region 6 is able to be achieved in comparison with refinement variant A. In this case, the following procedure may be adopted: the number of irradiation procedures without the area of the focal spot being changed is increased, the power used is increased and/or the feed rate is increased.

As an alternative, as depicted in refinement variant E, in the case of such a thermal treatment, the surface tension state of the molten material may also be utilized such that a resolidified track with a triangular cross section is formed. This may be achieved by adopting the following procedure in comparison with refinement variant A: the number of irradiation procedures without the area of the focal spot being changed is increased, the power used is reduced and/or the feed rate of the focal spot movement of the energy beam is reduced.

FIG. 3A schematically shows the measurement principle for the detection of a magnetically active security element S that is created by a track formed by way of a laser beam 3 by way of refinement variant C from FIG. 2.

If a magnetic flux 8 is induced in the component 1 in the region 10a to be examined, said flux impinges on the region of the removed material in the region of the ablated track 2 and, at the material/air interface, potentials having a corresponding magnetic structure form, which in turn lead to unidirectional magnetic stray fields 7 coming from magnetic poles 9 formed in a locally limited manner. As an alternative, the component 1 may also be magnetized by way of static magnetic fields.

The perpendicular field components of the magnetic stray fields 7 are able to be captured using a detection unit 10 and a graphic depiction 11 is able to be transferred to a display apparatus by an evaluation unit. An alternative to detecting the perpendicular field components of the magnetic stray fields 7 is to determine the magnetic structure in the region of the magnetic poles 9.

FIG. 3B shows a variant in which alternating magnetic fields are introduced into the component 1. Said magnetic poles 9 arise here in the region 5 of the molten and rapidly solidified magnetic material, a phase conversion being able to take place depending on the alloy.

FIG. 4 is a sectional depiction in principle of the formation of a security element S in the form of an ablated track 2 and the application of an opaque top layer 12 made from a colored pigment layer, varnish layer, polyether layer, calcium sulfate dihydrate layer or epoxy resin layer to the surface 1a of a component 1. The top layer 12 hides the security element S from being perceived by the naked eye or by haptic touch.

FIG. 5 shows a depiction in principle of an exemplary security element S during a generative production process.

During application-based production, a non-magnetic material, such as for example aluminum, is applied to a substrate 13 in layers in the form of powder 14 and sintered by way of a laser beam 3 (FIG. 5A). In doing so, locally defined recesses 15 are formed. These recesses 15 form the geometric shape of a product logo or company logo that is intended to serve as security element S. The recesses 15 are intended to be arranged at a spacing of at most 1 mm, preferably 0.3 mm, from the surface 1a of the component 1 once the component 1 is complete. The width and the height of the recesses 15 lie in the range of 50 µm to 370 µm.

A magnetic material 16, such as for example a ferromagnetic iron alloy, different from the material of the component 1 is then introduced into the recesses 15 (FIG. 5B). The powder of the introduced material 16 should have a permeability different from that of the material of the component, that is to say it should amplify normal external magnetic fields inside by a greater factor.

The introduced material 16 is melted locally by way of a laser beam 3, such that it adopts the cross section 17 of the previously formed free space (FIGS. 5C and 5D). In an alternative variant embodiment, the introduced material may be left in its original form.

By applying an additional top layer 12 made from the basic material or a material different from the basic material, it is possible to seal the security element S on the surface 1a of the component 1 (FIG. 5E), such that optical and/or haptic recognition is not possible without auxiliary means.

The invention claimed is:

1. A method for forming and detecting security elements on the surface of a component or in a component, in which
   at least one layer or at least one region formed of a magnetic material or of a material different from a component material is formed on the surface of the component or in the component formed of a magnetic or of a non-magnetic material in a locally and geometrically defined manner,
   wherein
   at least one ablated track, at least one heat-affected region, or at least one remelted treatment track is formed by a locally and geometrically defined ablation of material or input of energy on/at the surface of a component along a predefined contour corresponding to a respective security feature or
   in the manufacture of the component, a magnetic material different from the material of the component is introduced into the component at least one predefined position in a locally and geometrically defined manner by way of a generative production process
   and
   to detect a security element, a magnetization unit is used to generate at least one magnetic field penetrating into the component or a magnetic flux is produced inside the magnetization unit that penetrates into the component and
   to check a security element formed in this way, a detection unit is used to detect magnetic stray fields occurring on the security element as a result of the at least one magnetic field, and measurement signals captured by the detection unit are transferred to an evaluation unit having an image-processing or pattern-recognition system, and
   using the evaluation unit having an image-processing or pattern-recognition system, it is checked, by way of the detected magnetic stray fields, whether or not the detected security element corresponds to a specification.

2. The method as claimed in claim 1, characterized in that the locally and geometrically defined ablation of material or the input of energy for forming a security element is achieved by way of an energy beam.

3. The method as claimed in claim 1, characterized in that in the manufacture of the component a further material is introduced into the inside of the component, wherein the further material is a non-magnetic material or a magnetic material different from the material of the component.

4. The method as claimed in claim 1, characterized in that at least one ablated track is at least partially filled with a material different from the component material.

5. The method as claimed in claim 1, characterized in that a security feature not visible to the eye without auxiliary means and not haptically recognizable without auxiliary means is formed.

6. The method as claimed in claim 1, characterized in that an optically non-transparent top layer is applied to a security element formed on the surface of a component.

7. The method as claimed in claim 1, characterized in that machine-readable one-dimensional, two-dimensional or quasi-three-dimensional information is formed on the security feature.

8. The method as claimed in claim 1, characterized in that the locally and geometrically defined ablation of material or the input of energy for forming a security element is achieved by way of an energy beam, wherein the energy beam is a laser beam, electron beam, or ion beam.

9. The method as claimed in claim 1, characterized in that at least one ablated track is at least partially filled with a non-magnetic material.

10. The method as claimed in claim 1, characterized in that an optically non-transparent, varnish or insulation, top layer is applied to a security element formed on the surface of a component.

\* \* \* \* \*